(12) United States Patent
Shen et al.

(10) Patent No.: US 6,342,667 B1
(45) Date of Patent: Jan. 29, 2002

(54) THERMAL ISOLATION STRUCTURE FOR A MICRO THERMOPILE AND METHOD FOR MAKING THE SAME

(75) Inventors: Chih-Hsiung Shen, Hsin Chu; Chung-Nan Chen, Hsin Tien; San Bao Lin, Chuang Li, all of (TW)

(73) Assignee: Opto Tech Corporation, Hsin Chu (TW)

(*) Notice: Subject to any disclaimer, the term of this patent is extended or adjusted under 35 U.S.C. 154(b) by 0 days.

(21) Appl. No.: 09/432,696

(22) Filed: Nov. 2, 1999

(51) Int. Cl.[7] ............................. H01L 35/34; G01J 5/06
(52) U.S. Cl. .................. 136/201; 136/213; 136/225; 374/121; 374/179; 29/847; 29/852; 250/338.1
(58) Field of Search ................. 136/201, 213, 136/225, 224, 227, 230; 374/179, 208, 121; 250/338.1; 29/847, 852, 595, 846

(56) References Cited

U.S. PATENT DOCUMENTS 5,193,911 A * 3/1993 Nix et al. ................ 374/121
6,203,194 B1 * 3/2001 Beerwerth et al. .......... 136/230

FOREIGN PATENT DOCUMENTS

| JP | 61-0038427 | * | 2/1986 | ............. 250/338.1 |
| JP | 4-006424 | * | 1/1992 | ................. 374/121 |

* cited by examiner

Primary Examiner—Diego Gutierrez
Assistant Examiner—Stanley J. Pruchnic, Jr.
(74) Attorney, Agent, or Firm—Rosenberg, Klein & Lee

(57) ABSTRACT

A method for forming thermal isolation for a micro thermopile device comprises steps of forming a narrow etching window on the membrane and forming a plurality of micro connection structures each crossing the narrow etching window and connecting the edge portion of the membrane on both sides of the narrow etching window, and etching the silicon substrate through the narrow etching window to form a pit between the silicon substrate and the membrane, whereby the membrane becomes a floating membrane and has thermal isolation with the silicon substrate. By this method, the area of the floating membrane is increased and the strain of the floating membrane is reduced.

10 Claims, 5 Drawing Sheets

THERMAL ISOLATION STRUCTURE FOR A MICRO THERMOPILE AND METHOD FOR MAKING THE SAME

FIELD OF THE INVENTION

The present invention relates to a thermopile device, especially to a thermal isolation structure for a micro thermopile and method for making the same.

BACKGROUND OF THE INVENTION

The conventional thermal isolation methods for micro thermopile devices are generally classified into the frontside etching process and the backside etching process. FIG. 1 shows the perspective view of a micro thermopile device fabricated by a conventional frontside etching process, and FIG. 2 shows the top view thereof. The micro thermopile device shown in FIGS. 1 and 2 is fabricated through following process: preparing a silicon substrate 12, forming a one-layer or multi-layer membrane 14 on the surface of the silicon substrate 12; forming black body 13 and thermopile 15 on the membrane 14, defining a plurality of etching windows 16, performing anisotropic etching to the silicon substrate 12 through the etching windows 16 and forming a pit between the silicon substrate 12 and the membrane 14 such that the membrane 14 becomes a floating membrane 18 and has thermal isolation with the silicon substrate 12.

However, in the above mentioned process, the trench below each of the etching windows 16 should overlap each other to form the pit, therefore, the area of the floating membrane 18 restricted by the etching windows 16 is relatively smaller. Moreover, the etching of the silicon substrate 12 below the center of the floating membrane 18 takes considerable time such that the floating membrane 18 probably cracks.

It is an object of the present invention to provide a thermal isolation structure for micro thermopile and the method making the same, by which the area of the floating membrane is increased and the strain of the floating membrane is reduced.

To achieve above objects, the present invention provides a method for forming thermal isolation for a micro thermopile device. The micro thermopile device has a silicon substrate and a one-layer or multi-layer membrane on the silicon substrate. The inventive method comprises steps of forming a narrow etching window on the membrane and forming a plurality of micro connection structures each crossing the narrow etching window and connecting the edge portion of the membrane on both sides of the narrow etching window, and etching the silicon substrate through the narrow etching window to form a pit between the silicon substrate and the membrane, whereby the membrane becomes a floating membrane and has thermal isolation with the silicon substrate.

The various objects and advantages of the present invention will be more readily understood from the following detailed description when read in conjunction with the appended drawings, in which:

DETAILED DESCRIPTION OF THE PREFERRED EMBODIMENTS

Figure 1:
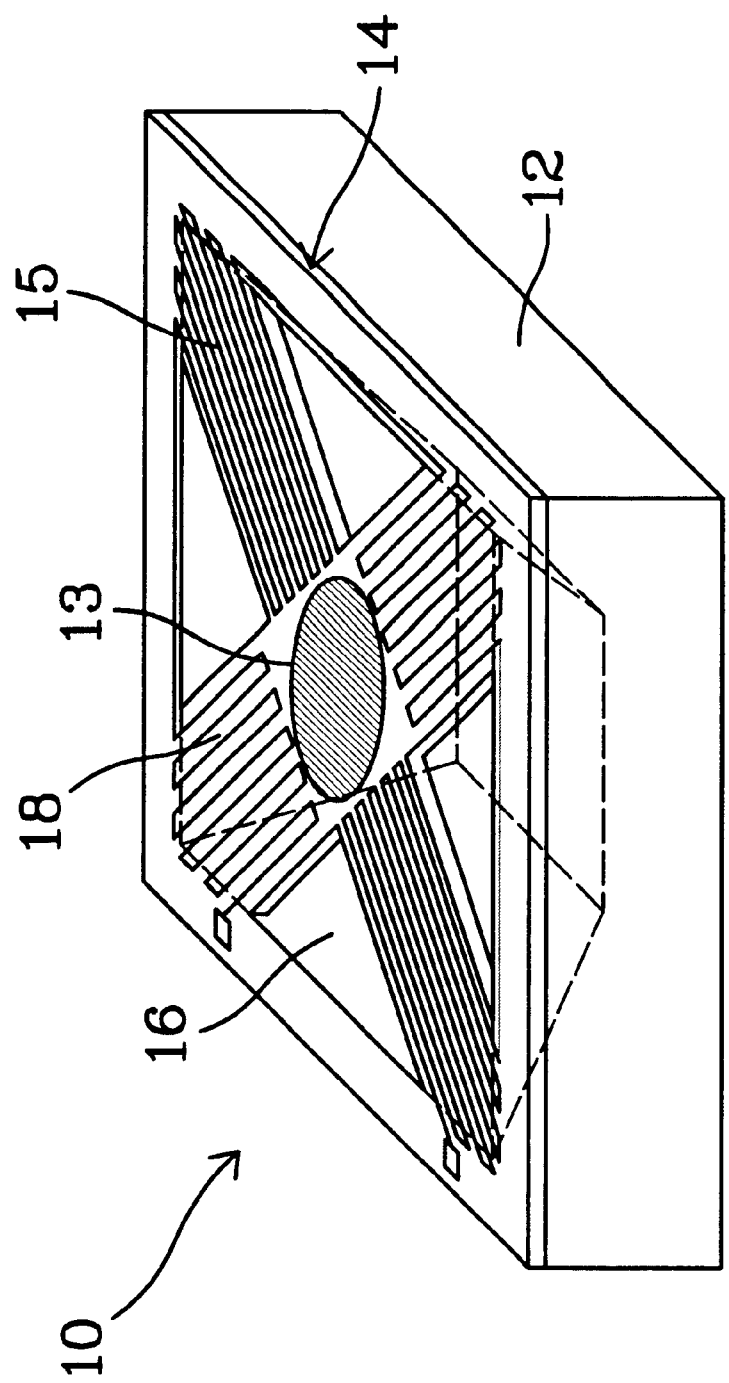
FIG. 1 is a perspective view of a micro thermopile device fabricated by a conventional frontside etching process.
Figure 2:
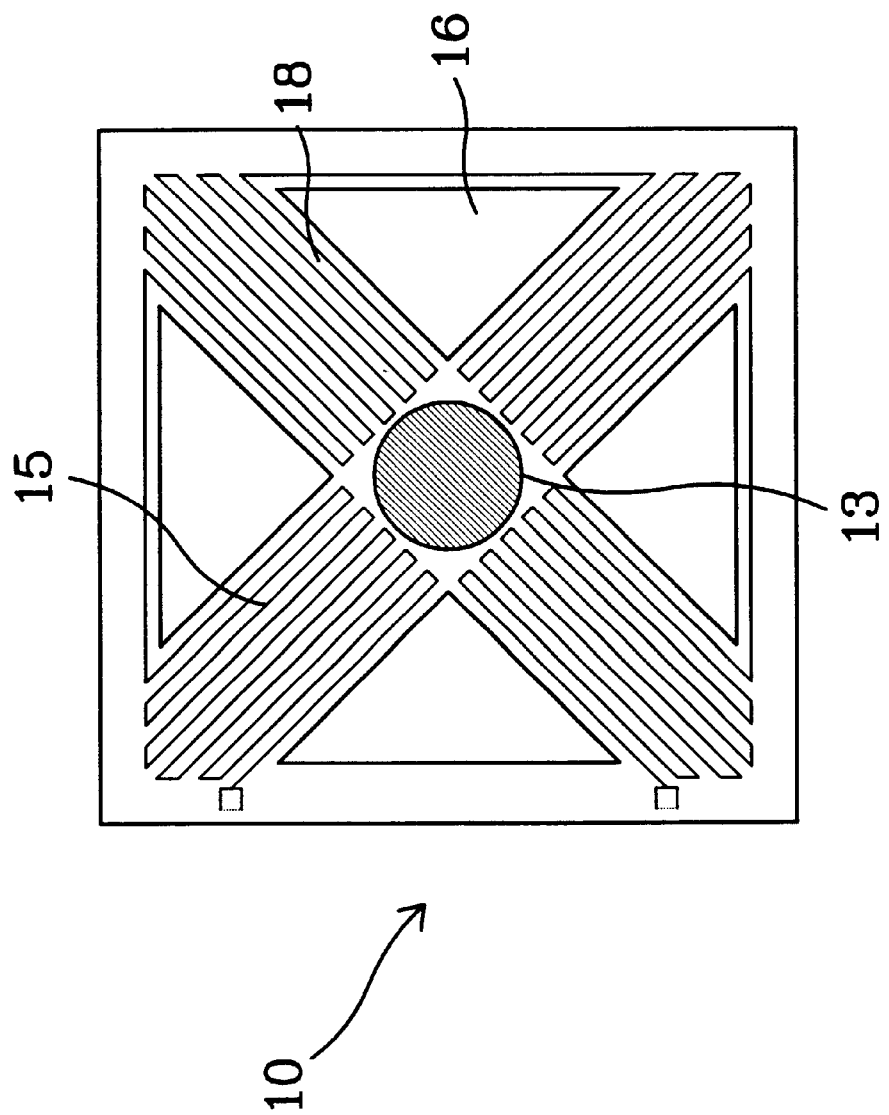
FIG. 2 shows the top view of the micro thermopile device in FIG. 1.
Figure 3:
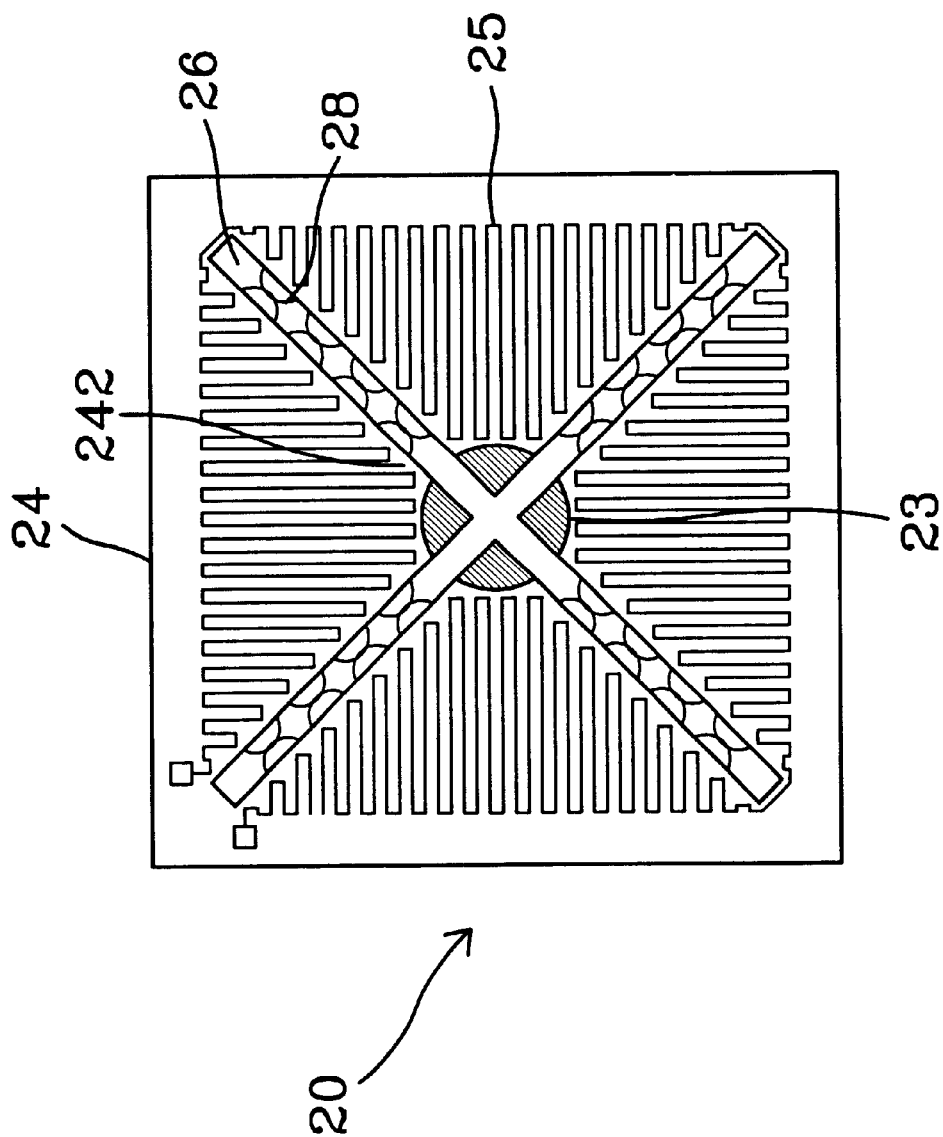
FIG. 3 shows the top view of the micro thermopile device according to a preferred embodiment of the present invention.
Figure 4:
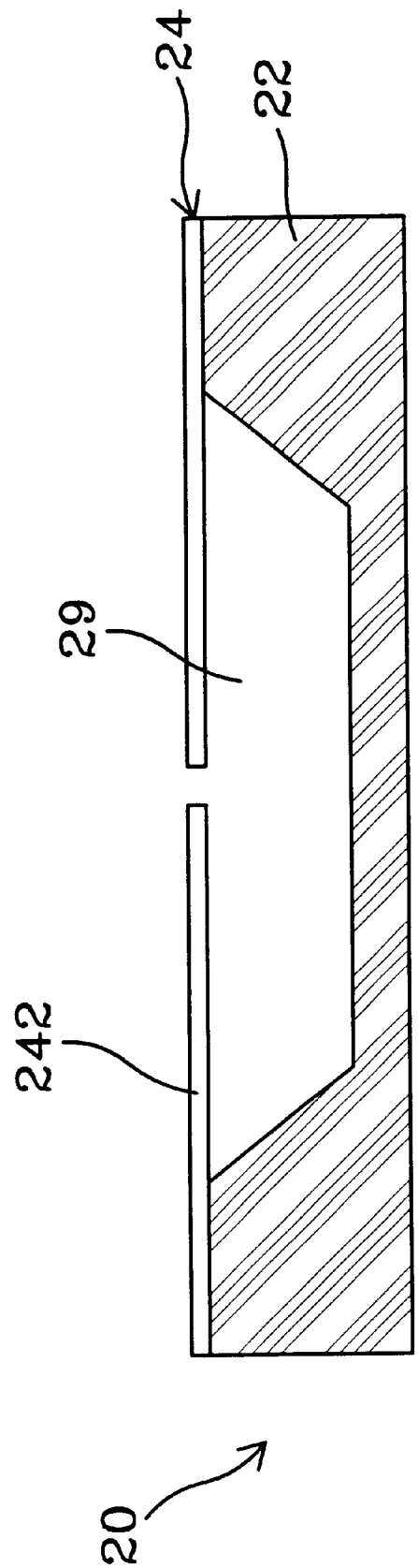
FIG. 4 shows the cross section view of the micro thermopile device according to a preferred embodiment of the present invention.

FIGS. 3 and 4 show the top view and the cross section of the micro thermopile device according to a preferred embodiment of the present invention, respectively. The micro thermopile device 20 according to the first preferred embodiment of the present invention comprises a floating membrane 24 on the top surface of a substrate 22, a pit 29 formed between the floating membrane 24 and the substrate 22, at least one black body 23 and at least one thermopile 25 formed on the floating membrane 24, an etching window 26 of a cross-shaped slot configuration and partitioning the floating membrane 24 into a plurality of projecting arms 242, and a plurality of micro connection structures 28. Each of the micro connection structures 28 is of strip shape and extends across the etching window 26, and connects two projecting arms 242 on both sides of the etching window 26. More particularly, the plurality of micro connection structures 28 are narrow strips that cross each of another and connecting two adjacent projecting arms 242, thus sustaining the projecting arms 242.

The micro thermopile device according to a preferred embodiment of the present invention can be fabricated by the following processing steps: preparing a substrate 22 such as a silicon substrate 22, forming a one-layer or multi-layer membrane on the surface of the silicon substrate 22; forming at least one black body 23 and at least one thermopile 25 on the membrane, defining an etching window 26 to expose the silicon substrate 22. The etching window 26 is a cross-shape narrow slot on the membrane and a following etching step is performed based on the cross-shape slot to form a plurality of micro connection structures 28 crossing the etching windows 26. The micro connection structures 28 are narrow strips each one crossing another and connecting two adjacent portions of the membrane on both sides of the cross-shaped etching windows 26. Afterward, the silicon substrate 22 is etched through the etching windows 26 to form a pit 29 between the membrane and the silicon substrate 22. Moreover, the membrane is etched to form a floating membrane 24 with a plurality of projecting arms 242. The pit 29 provides thermal isolation between the floating membrane 24 and the silicon substrate 22.

The etching window 26 has such shape that a floating membrane 24 with larger area is more achievable. Moreover, the trenches under the etching window 26 are more likely to overlap each other. The etching rate of the silicon substrate 22 is increased to reduce the possibility of cracking floating membrane 24.

Figure 5:
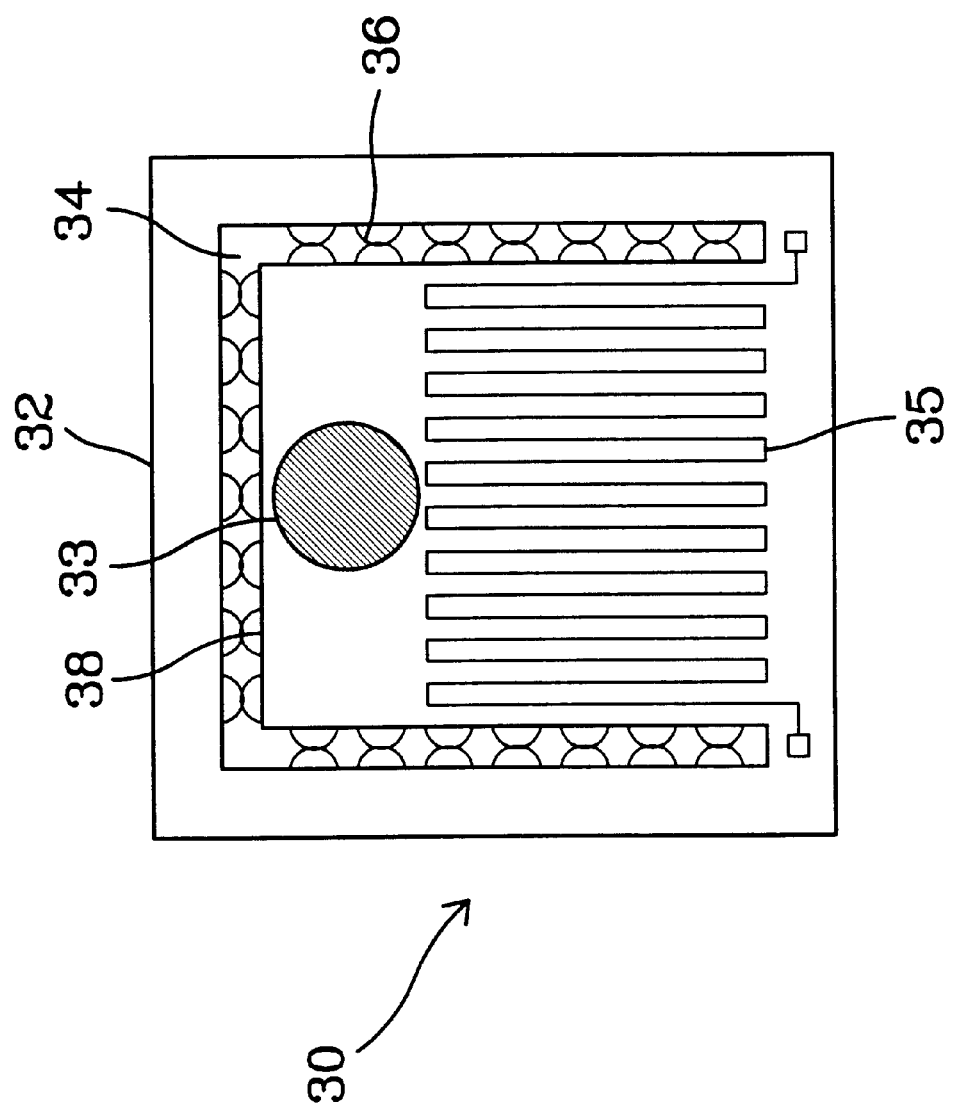
FIG. 5 shows the top view of the micro thermopile device according to another preferred embodiment of the present invention.

Moreover, the etching window 26 can have various shapes and configuration. FIG. 5 shows the top view of the micro thermopile device according to another preferred embodiment of the present invention. The micro thermopile device 30 comprises a floating membrane 32 and an etching window 34 of a bent slot configuration. The etching window 34 cuts the floating membrane 32 to form a single projecting arm 38. At least one black body 33 and at least one thermopile 35 are formed on the single projecting arm 38. Moreover, a plurality of micro connection structures 36 crossing the etching windows 34 are formed. The micro connection structures 36 cross each other and connect two adjacent portions of the membrane 32 on both sides of the etching windows 34.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A micro thermopile device comprising
   a substrate;
   a floating membrane formed on top surface of said substrate;
   an etching window partitioning said floating membrane;
   a plurality of micro connection structures crossing said etching window and connecting said partitioned floating membrane on both sides of said etching window; and
   a pit formed between said substrate and said floating membrane.

2. The micro thermopile device as in claim 1, wherein said substrate is a silicon substrate.

3. The micro thermopile device as in claim 1, wherein said floating membrane is at least one projecting arm.

4. The micro thermopile device as in claim 1, wherein said etching window is a narrow slot.

5. The micro thermopile device as in claim 1, wherein said etching window is a narrow cross-shaped slot.

6. The micro thermopile device as in claim 1, wherein said etching window is a narrow bent slot.

7. The micro thermopile device as in claim 1, wherein said micro connection structures are narrow crossing strips.

8. A method for providing thermal isolation for a micro thermopile device, said micro thermopile device having a silicon substrate and a one-layer or multi-layer membrane on said silicon substrate, said method comprising steps of:
   forming a narrow etching window on said membrane and forming a plurality of micro connection structures each crossing said narrow etching window and connecting the edge portion of said membrane on both sides of said narrow etching window, and
   etching said silicon substrate through said narrow etching window to form a pit between said silicon substrate and said membrane, whereby said membrane becomes a floating membrane and has thermal isolation with said silicon substrate.

9. The method as in claim 8, wherein said step of forming a narrow etching window comprises the sub steps of:
   defining a cross-shaped narrow pattern on said membrane; and
   etching part of said membrane according to said cross-shaped narrow pattern.

10. The method as in claim 8, wherein said step of forming a narrow etching window comprises the sub steps of:
    defining a bent slot shaped narrow pattern on said membrane; and
    etching part of said membrane according to said bent slot shaped narrow pattern.

\* \* \* \* \*